United States Patent [19]
Tai

[11] Patent Number: 5,592,411
[45] Date of Patent: Jan. 7, 1997

[54] NON-VOLATILE REGISTER AND METHOD FOR ACCESSING DATA THEREIN

[75] Inventor: Jy-Der D. Tai, Phoenix, Ariz.

[73] Assignee: Motorola, Inc., Schaumburg, Ill.

[21] Appl. No.: 552,156

[22] Filed: Nov. 2, 1995

[51] Int. Cl.$^6$ ........................................... G11C 11/22
[52] U.S. Cl. ......................... 365/145; 365/149; 365/102
[58] Field of Search ................................. 365/145, 102, 365/65, 149, 117; 257/295

[56] References Cited

U.S. PATENT DOCUMENTS

| | | | |
|---|---|---|---|
| 4,419,743 | 12/1983 | Taguchi et al. | 365/149 |
| 4,888,733 | 12/1989 | Mobley | 365/145 |
| 4,893,272 | 1/1990 | Eaton, Jr. et al. | 365/145 |
| 5,031,143 | 7/1991 | Jaffe | 365/145 |
| 5,198,706 | 3/1993 | Papaliolios | 365/145 |
| 5,289,421 | 2/1994 | Lee et al. | 365/206 |
| 5,309,391 | 5/1994 | Papaliolios | 365/145 |
| 5,487,030 | 1/1996 | Drab et al. | 365/149 |
| 5,523,964 | 6/1996 | McMillan et al. | 365/145 |

OTHER PUBLICATIONS

Joseph T. Evans and Richard Womack, Reprint of IEEE Journal of Solid-State Circuits, "An Experimental 512-bit Nonvolatile Memory with Ferroelectric Storage Cell", Oct. 1988, vol. 23, No. 5, pp. 1171–1175 (233–237).

Ramtron International Corporation, "Fram Technology", Jan. 1994.

Ramtron International Corporation, "Benefits of Ramtron's FM24C04 Serial FRAM Memory", Feb. 1994.

*Primary Examiner*—Tan T. Nguyen
*Attorney, Agent, or Firm*—Rennie William Dover

[57] ABSTRACT

The present invention provides a non-volatile register (10) and a method for writing data into and reading data from the non-volatile register (10). When writing, a first pair of ferroelectric capacitors (14, 16) receives a data signal via a first pass gate (12) and a second pair of ferroelectric capacitors (24, 26) receives a complementary data signal via a second pass gate (32). An extraction signal and a restoration signal place the two pairs of ferroelectric capacitors (14, 16, 24, 26) into their respective polarization states depending on the data. When reading, the extraction signal produces a voltage difference in accordance with the data stored in the register (10) appearing at two voltage electrodes of a voltage detector (18). The voltage difference is amplified and transmitted from the register (10) via the two pass gates (12, 32). The restoration signal restores the data back to the non-volatile register (10).

20 Claims, 2 Drawing Sheets

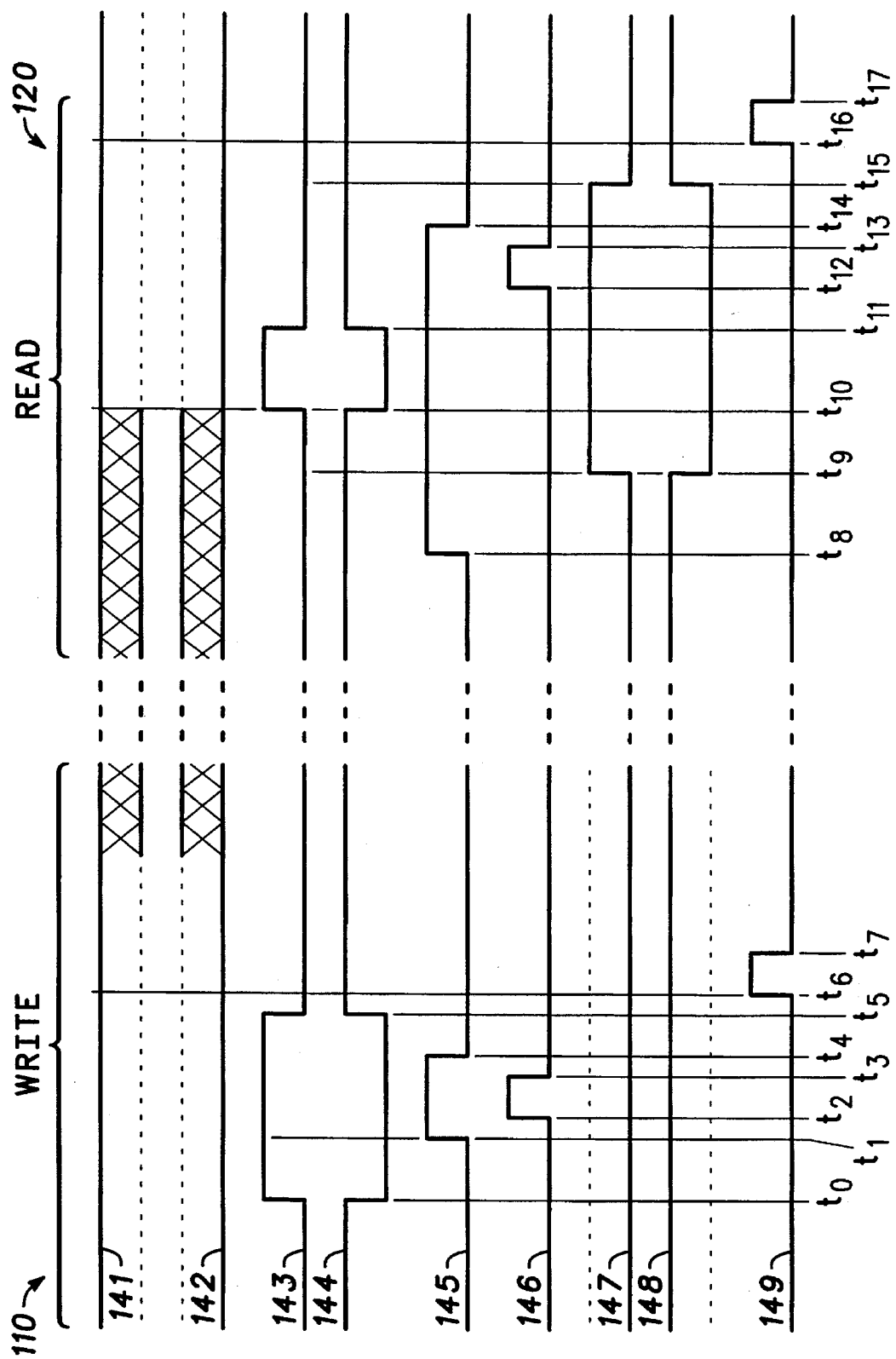

NON-VOLATILE REGISTER AND METHOD FOR ACCESSING DATA THEREIN

BACKGROUND OF THE INVENTION

The present invention relates, in general, to non-volatile memory elements, and more particularly, to ferroelectric non-volatile registers.

Non-volatile configuration registers are commonly used for memory mapping and security purposes. These non-volatile registers can be implemented as stand alone registers or as part of a non-volatile memory array such as an electrical erasable programmable read only memory (EEPROM). An advantage of having the non-volatile registers as a portion of an EEPROM is the convenience it affords in realizing a long register. However, if the register is only a single byte in length, this technique becomes inefficient in terms of area, speed, and power. For example, access of non-volatile registers in an EEPROM requires a sense amplifier that needs to be activated. The sense amplifier consumes a large amount of power and occupies a large area on a semiconductor die. Further, the non-volatile register shares a highly capacitive bit line with a memory array. This capacitance slows down the access of the register and requires additional power for charging and discharging.

In addition, when implementing non-volatile registers in a memory array, a row of the memory array is normally used. As those skilled in the art are aware, a single row of the memory array typically consists of 128 or 256 bits, depending on the memory array structure. Since a register only requires a few bits, using a memory array structure to implement a register leaves a large number of bits of the memory array unused and, therefore, wastes a large portion of the memory array. This unused portion of the memory array consumes a large portion of the semiconductor die which is also wasted.

Accordingly, it would be advantageous to have a configuration register in which the registers are separate from the memory array structure. It would be of further advantage for the registers to be modular and capable of being cascaded to form memory blocks of different sizes. It is also desirable that accessing data in the register be simple, fast, and energy efficient.

BRIEF DESCRIPTION OF THE DRAWINGS

FIG. 3 is a timing diagram for writing data into and reading data from the register of FIG. 1 in accordance with a timing embodiment of the present invention.

DETAILED DESCRIPTION OF THE DRAWINGS

Figure 1:
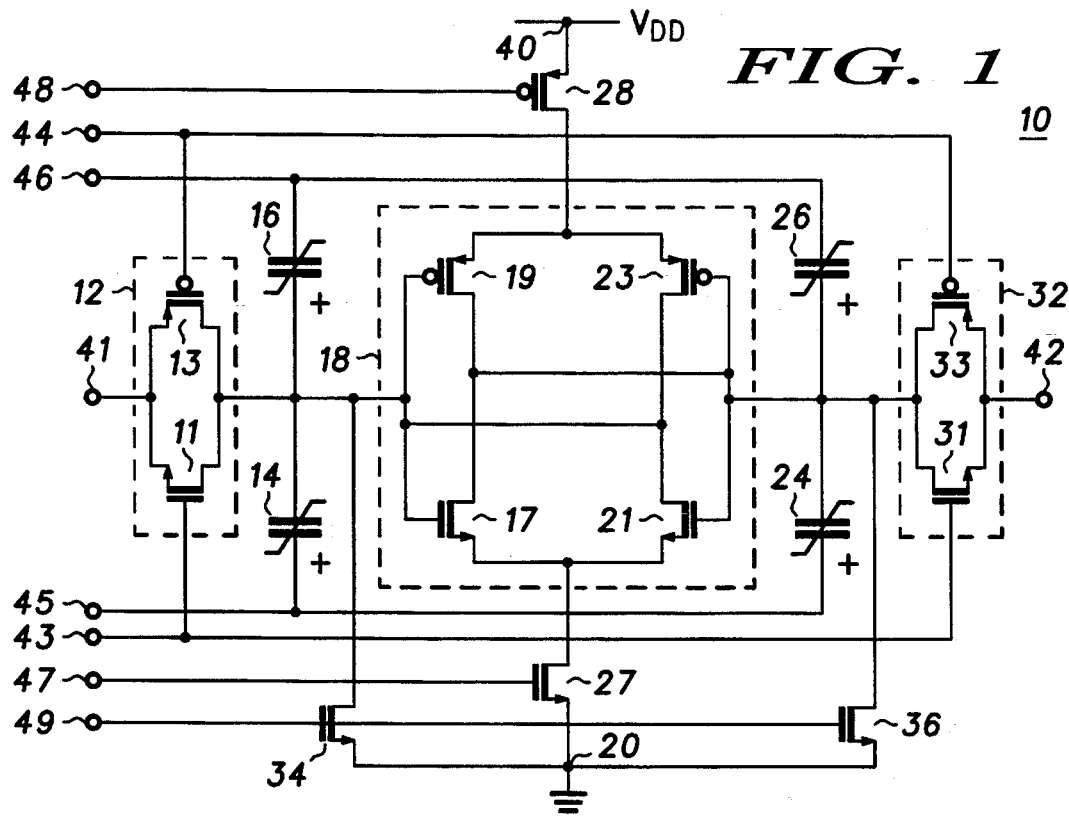
FIG. 1 is a schematic diagram of a non-volatile register in accordance with an embodiment of the present invention.

FIG. 1 is a schematic diagram of a non-volatile register 10 in accordance with an embodiment of the present invention. Register 10 includes pass gates 12 and 32, ferroelectric capacitors 14, 16, 24, and 26, a voltage detector 18, and transistors 27 and 28.

Pass gate 12 includes an n-channel metal oxide semiconductor field effect transistor (MOSFET) 11 and a p-channel MOSFET 13. A gate electrode of MOSFET 11 serves as a first control electrode of pass gate 12 and is connected to a node 43 for receiving a control signal. A gate electrode of MOSFET 13 serves as a second control electrode of pass gate 12 and is connected to a node 44 for receiving a complementary control signal. A source electrode of MOSFET 11 is connected to a source electrode of MOSFET 13 to form a first data electrode of pass gate 12. The first data electrode of pass gate 12 is connected to a node 41 for transmitting a data signal. A drain electrode of MOSFET 11 is connected to a drain electrode of MOSFET 13 to form a second data electrode of pass gate 12. It should be noted that the structure of pass gate 12 is not limited to the embodiment shown in FIG. 1. Suitable structures for pass gate 12 include pass gates capable of transmitting logical signals in two directions, single transistor pass gates having a single control electrode, or the like. As those skilled in the art are aware, the control signal applied to the control electrode of a single transistor pass gate structure may be different from the control signals applied to the control electrodes of a multi-transistor pass gate structure, e.g., pass gate 12.

A first electrode of capacitor 14 is connected to a node 45 for receiving an extraction signal. A second electrode of capacitor 14 is connected to the second data electrode of pass gate 12 and to a first electrode of capacitor 16. A second electrode of capacitor 16 is connected to a node 46 for receiving a restoration signal.

Voltage detector 18 includes n-channel MOSFETs 17 and 21, and p-channel MOSFETs 19 and 23. MOSFETs 17 and 19 form a first inverter and MOSFETs 21 and 23 form a second inverter. A gate electrode of MOSFET 17 is connected to a gate electrode of MOSFET 19 to form an input of the first inverter. A drain electrode of MOSFET 17 is connected to a drain electrode of MOSFET 19 to form an output of the first inverter. A source electrode of MOSFET 17 and a source electrode of MOSFET 19 form a first enable electrode and a second enable electrode of the first inverter, respectively. A gate electrode of MOSFET 21 is connected to a gate electrode of MOSFET 23 to form an input of the second inverter. A drain electrode of MOSFET 21 is connected to a drain electrode of MOSFET 23 to form an output of the second inverter. A source electrode of MOSFET 21 and a source electrode of MOSFET 23 form a first enable electrode and a second enable electrode of the second inverter, respectively. The input of the first inverter and the output of the second inverter are connected together to form a first voltage electrode of voltage detector 18. The output of the first inverter and the input of the second inverter are connected together to form a second voltage electrode of voltage detector 18. The first enable electrode of the first inverter and the first enable electrode of the second inverter are connected together to form a first control electrode of voltage detector 18. The second enable electrode of the first inverter and the second enable electrode of the second inverter are connected together to form a second control electrode of voltage detector 18.

The first voltage electrode of voltage detector 18 is connected to the second electrode of capacitor 14. The first control electrode of voltage detector 18 is coupled to a node 20 via n-channel MOSFET 27. By way of example, node 20 is at a lower supply voltage, e.g., a ground voltage level. The ground voltage level is also referred to as ground. A gate electrode of MOSFET 27 is connected to a node 47 for receiving an activation signal. A source electrode of MOSFET 27 is connected to node 20 and a drain electrode of MOSFET 27 is connected to the first control electrode of voltage detector 18. The second control electrode of voltage detector 18 is coupled to a node 40 via p-channel MOSFET 28. By way of example, node 40 is at a upper supply voltage level, e.g., $V_{DD}$. A gate electrode of MOSFET 28 is connected to a node 48 for receiving a complementary activation signal. A source electrode of MOSFET 28 is connected to node 40 and a drain electrode of MOSFET 28 is connected to the second control electrode of voltage detector 18.

A first electrode of capacitor 24 is connected to node 45 for receiving the extraction signal. A second electrode of capacitor 24 is connected to the second voltage electrode of voltage detector 18 and to a first electrode of capacitor 26. A second electrode of capacitor 26 is connected to node 46 for receiving the restoration signal.

Pass gate 32 includes an n-channel MOSFET 31 and a p-channel MOSFET 33. A gate electrode of MOSFET 31 serves as a first control electrode of pass gate 32 and is connected to node 43 for receiving the control signal. A gate electrode of MOSFET 33 serves as a second control electrode of pass gate 32 and is connected to node 44 for receiving the complementary control signal. A source electrode of MOSFET 31 is connected to a source electrode of MOSFET 33 to form a first data electrode of pass gate 32. The first data electrode of pass gate 32 is connected to a node 42 for transmitting a complementary data signal. A drain electrode of MOSFET 31 is connected to a drain electrode of MOSFET 33 to form a second data electrode of pass gate 32. The second data electrode of pass gate 32 is connected to the second electrode of capacitor 24. It should be noted that the structure of pass gate 32 is not limited to the embodiment shown in FIG. 1. Suitable structures for pass gate 32 include pass gates capable of transmitting logical signals in two directions, single transistor pass gates having a single control electrode, or the like.

Register 10 further includes n-channel MOSFETs 34 and 36. A gate electrode of MOSFET 34 and a gate electrode of MOSFET 36 are connected to a node 49 for receiving a discharging signal. A source electrode of MOSFET 34 and a source electrode of MOSFET 36 are connected to node 20. A drain electrode of MOSFET 34 is connected to the second electrode of capacitor 14. A drain electrode of MOSFET 36 is connected to the second electrode of capacitor 24. After each "write" or "read" operation, MOSFETs 34 and 36 may be activated to discharge capacitors 14, 16, 24, and 26 to reduce the stress induced by the voltages across these capacitors. It should be noted that, in accordance with the present invention, MOSFETs 34 and 36 are optional.

It should be understood that each MOSFET in FIG. 1 functions as a switch. Therefore, the MOSFETs in FIG. 1 are not limited to being field effect transistors. Any switch having a control electrode and two current conducting electrodes can replace the MOSFETs in FIG. 1. For example, all MOSFETs in FIG. 1 can be replaced with bipolar transistors, insulated gate bipolar transistors, or the like. As those skilled in the art are aware, when using a MOSFET as a switch, the gate electrode of the MOSFET corresponds to the control electrode of the switch, the source and drain electrodes of the MOSFET correspond to the current conducting electrodes of the switch.

The polarization states of capacitors 14, 16, 24, and 26 determine the logical value of the data stored in register 10. The voltage across each of capacitors 14, 16, 24, or 26 is defined as positive when the potential at the electrode of the corresponding capacitor with a positive sign is higher than the potential at the other electrode of the capacitor. The polarity of the charge in each of capacitors 14, 16, 24, or 26 is defined as positive when the charge on the electrode of the corresponding capacitor with the positive sign is positive.

Figure 2:
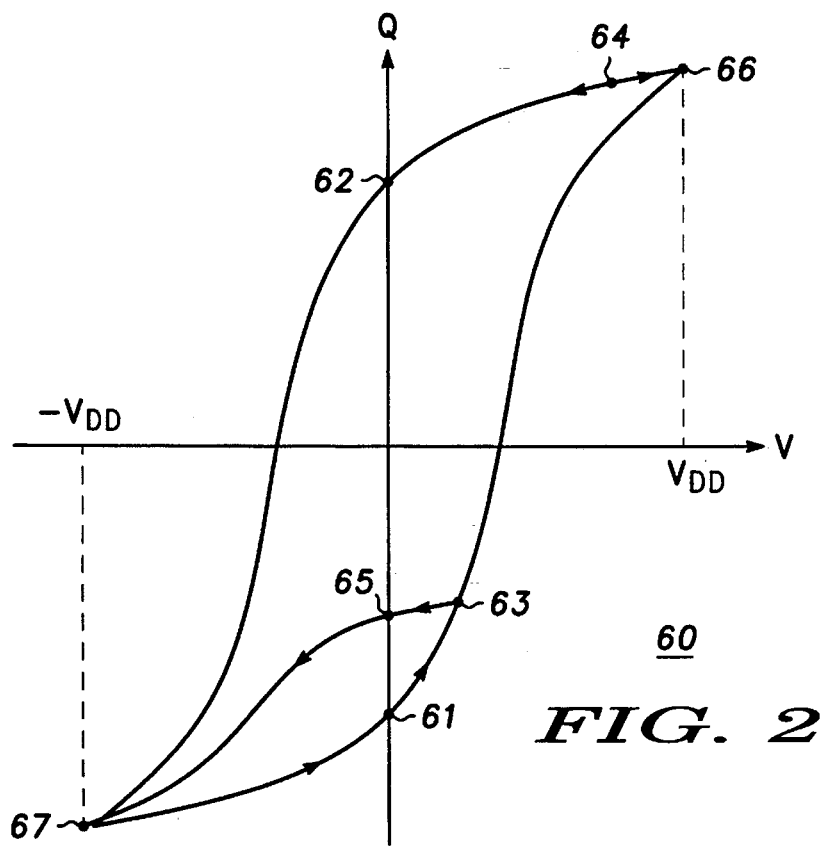
FIG. 2 is a hysteresis loop of polarization charge (Q) as a function of voltage (V) in a ferroelectric capacitor in the register of FIG. 1 during writing and reading operations.

FIG. 2 is a hysteresis loop 60 of polarization charge (Q) as a function of voltage (V) in a ferroelectric capacitor in register 10 during reading and writing operations. When the voltage across a ferroelectric capacitor in a register containing data is zero, the ferroelectric capacitor is in either a first polarization state 61 or a second polarization state 62. If a first logical value is stored in register 10 of FIG. 1, capacitors 14 and 26 are in polarization state 61, and capacitors 16 and 24 are in polarization state 62. If a second logical value, which is complementary to the first logical value, is stored in register 10 of FIG. 1, capacitors 16 and 24 are in polarization state 61, and capacitors 14 and 26 are in polarization state 62. A ferroelectric capacitor in register 10 of FIG. 1 may enter intermediate states 63 and 64, saturation states 66 and 67, and neutral state 65 in hysteresis loop 60 during the writing and reading operations, as will be discussed with reference to FIG. 3.

FIG. 3 is a timing diagram 100 in accordance with a timing embodiment of the present invention. Timing diagram 100 includes complementary data signals 141 and 142, complementary control signals 143 and 144, an extraction signal 145, a restoration signal 146, complementary activation signals 147 and 148, and a discharging signal 149 for writing data into and reading data from register 10 of FIG. 1. Complementary data signals 141 and 142 are applied to nodes 41 and 42, respectively, of register 10 in FIG. 1. Complementary control signals 143 and 144 are applied to nodes 43 and 44, respectively, of register 10. Extraction signal 145 is applied to node 45 of register 10. Restoration signal 146 is applied to node 46 of register 10. Complementary activation signals 147 and 148 are applied to nodes 47 and 48, respectively, of register 10. Discharging signal 149 is applied to node 49 of register 10. A write section 110 illustrates the timing signals for writing the first logical value, e.g., "one", into register 10 of FIG. 1. A read section 120 illustrates the timing signals for reading data from register 10 of FIG. 1 when register 10 stores the first logical value, e.g., "one".

Before a "write" command is executed, pass gates 12 and 32 are non-conductive, voltage detector 18 is disabled, extraction signal 145, restoration signal 146, and discharging signal 149 are at ground, and the voltages across capacitors 14, 16, 24, and 26 are zero. To write a logical "one" into register 10, data signal 141 is placed at a voltage level of, for example, $V_{DD}$, which represents logical "one". Complementary data signal 142 is placed at ground, which represents logical "zero".

At time $t_0$, pass gates 12 and 32 of register 10 are placed in conductive states by complementary control signals 143 and 144. The voltage levels at nodes 41 and 42 are transmitted to the second electrodes of capacitors 14 and 24 of register 10, respectively. The voltages across capacitors 14 and 16 are $-V_{DD}$ and $+V_{DD}$, respectively. Capacitor 14 enters saturation state 67 and capacitor 16 enters saturation state 66 as shown in hysteresis loop 60 of FIG. 2. It should be noted that capacitors 14 and 16 enter saturation states 67 and 66, respectively, regardless of their initial conditions. The voltages across capacitors 24 and 26 remain at zero.

At time $t_1$, extraction signal 145 is raised to $V_{DD}$. Likewise, at time $t_2$, restoration signal 146 is raised to $V_{DD}$. The voltage across capacitors 14 and 16 change to zero. The state of capacitor 14 changes from saturation state 67 to polarization state 61 and the state of capacitor 16 changes from saturation state 66 to polarization state 62 as shown in hysteresis loop 60 of FIG. 2. The voltage across capacitors 24 and 26 change to $+V_{DD}$ and $-V_{DD}$, respectively. Capacitor 24 enters saturation state 66 and capacitor 26 enters saturation state 67 as shown in hysteresis loop 60 of FIG. 2. It should be noted that capacitors 24 and 26 enter saturation states 66 and 67, respectively, regardless of their initial conditions.

At time $t_3$, restoration signal 146 is lowered to ground. Likewise, at time $t_4$, extraction signal 145 is lowered to ground. The voltage across capacitors 14 and 16 change from zero to $-V_{DD}$ and $+V_{DD}$, respectively. The state of capacitor 14 changes from polarization state 61 to saturation state 67 and the state of capacitor 16 changes from polarization state 62 to saturation state 66 as shown in hysteresis loop 60 of FIG. 2. The voltage across capacitors 24 and 26 change from $+V_{DD}$ and $-V_{DD}$, respectively, to zero. The state of capacitor 24 changes from saturation state 66 to polarization state 62 and the state of capacitor 26 changes from saturation state 67 to polarization state 61 as shown in hysteresis loop 60 of FIG. 2.

It should be noted that, in accordance with the present invention, the chronological order of times $t_1$, $t_2$, $t_3$, and $t_4$ is not limited to being exactly the same as that of the embodiment shown in write section 110 of timing diagram 100. The occurrence of the rising edge of extraction signal 145, time $t_1$, precedes the occurrence of the falling edge of extraction signal 145, time $t_4$. The occurrence of the rising edge of restoration signal 146, time $t_2$, precedes the occurrence of the falling edge of restoration signal 146, time $t_3$. However, the operation of writing data into register 10 is independent of the chronological relation between extraction signal 145 and restoration signal 146. For example, time $t_1$ can occur after time $t_2$ or time $t_3$ and time $t_2$ can occur after time $t_4$.

At time $t_5$, complementary control signals 143 and 144 place pass gates 12 and 32 in non-conductive states, thereby isolating capacitors 14 and 16 from node 41 and isolating capacitors 24 and 26 from node 42. It should be noted that, after time $t_5$, complementary data signals 141 and 142 may be removed from nodes 41 and 42, respectively.

In a time interval between times $t_6$ and $t_7$, discharging signal 149 places MOSFETs 34 and 36 into conductive states, thereby discharging capacitors 14, 16, 24, and 26. The voltages across capacitors 14, 16, 24, and 26 are now equal to zero. Thus, capacitors 14 and 26 are in polarization state 61 and capacitors 16 and 24 are in polarization state 62 as shown in hysteresis loop 60 of FIG. 2. It should be noted that, in accordance with the present invention, discharging capacitors 14, 16, 24, and 26 is optional. If not discharged, the states of capacitors 14, 16, 24, and 26 change to their respective polarization states, i.e., 61 and 62, because of the leakage from ferroelectric capacitors. In either case, a logical "one" is written into register 10.

In accordance with the present invention, the operation of writing the second logical value, e.g., "zero", into register 10 includes steps analogous to those for the operation of writing a logical "one" into register 10. It should be noted that, when writing a logical "zero" into register 10, data signal 141 is placed at ground and complementary data signal 142 is placed at $V_{DD}$. Therefore, after the writing operation, capacitors 14 and 26 are in polarization state 62 and capacitors 16 and 24 are in polarization state 61 as shown in hysteresis loop 60 of FIG. 2. It should be noted that capacitors 14, 16, 24, and 26 enter their respective polarization states regardless of their states before the writing operation.

Before a "read" command is executed, pass gates 12 and 32 are non-conductive, voltage detector 18 is disabled, extraction signal 145, restoration signal 146, and discharging signal 149 are placed at ground, and the voltages across capacitors 14, 16, 24, and 26 are zero. It is assumed that register 10 stores the first logical value, e.g., "one". Thus, capacitors 14 and 26 are in polarization state 61 and capacitors 16 and 24 are in polarization state 62, as shown in hysteresis loop 60 of FIG. 2.

At time $t_8$, extraction signal 145 is raised to $+V_{DD}$. Because pass gates 12 and 32 are non-conductive and voltage detector 18 is disabled, the nodes connected to the second electrodes of capacitors 14 and 24 are isolated from an applied voltage level.

The total voltage across capacitors 14 and 16 is $V_{DD}$. An electric field created in capacitor 14 by the voltage across its electrodes is in the opposite direction from its initial polarization field. The electric field depolarizes capacitor 14 and may polarize capacitor 14 in the opposite direction depending on the ratio of the capacitance of capacitor 14 to that of capacitor 16. The state of capacitor 14 changes from polarization state 61 to intermediate state 63 as shown in hysteresis loop 60 of FIG. 2. An electric field created in capacitor 16 by the voltage across its electrodes is in the same direction as its initial polarization field. The electric field further polarizes capacitor 16. The state of capacitor 16 changes from polarization state 62 to intermediate state 64 as shown in hysteresis loop 60 of FIG. 2. In the process, an amount of polarization charge equal to the charge difference between intermediate state 63 and polarization state 61 is transferred from capacitor 14 to capacitor 16. The charge difference between intermediate state 64 and polarization state 62, which represents the polarization charge increase in capacitor 16, and the charge difference between intermediate state 63 and polarization state 61, which represents the polarization charge decrease in capacitor 14, are equal to each other. The voltage at the node connected to the second electrode of capacitor 14 is now equal to the voltage across capacitor 16, which is greater than the voltage across capacitor 14.

Likewise, the total voltage across capacitors 24 and 26 is $V_{DD}$. An electric field created in capacitor 24 by the voltage across its electrodes is in the same direction as its initial polarization field. The electric field further polarizes capacitor 24. The state of capacitor 24 changes from polarization state 62 to intermediate state 64 as shown in hysteresis loop 60 of FIG. 2. An electric field created in capacitor 26 by the voltage across its electrodes is in the opposite direction from its initial polarization field. The electric field depolarizes capacitor 26 and may polarize capacitor 26 in the opposite direction depending on the ratio of the capacitance of capacitor 26 to that of capacitor 24. The state of capacitor 26 changes from polarization state 61 to intermediate state 63 as shown in hysteresis loop 60 of FIG. 2. In the process, an amount of polarization charge equal to the charge difference between intermediate state 63 and polarization state 61 is transferred from capacitor 26 to capacitor 24. The charge difference between intermediate state 64 and polarization state 62 represents the polarization charge increase in capacitor 24 and the charge difference between intermediate state 63 and polarization state 61 represents the polarization charge decrease in capacitor 26. The voltage at the node connected to the second electrode of capacitor 24 is now equal to the voltage across capacitor 26, which is less than the voltage across capacitor 24. At time $t_9$, voltage detector 18 is activated by complementary activation signals 147 and 148 applied to the gate electrodes of MOSFETs 27 and 28, respectively. Voltage detector 18 detects that the voltage at its first voltage electrode, which is connected to the second electrode of capacitor 14, is higher than the voltage at its second voltage electrode, which is connected to the second electrode of capacitor 24. MOSFETs 17 and 23 become conductive. Voltage detector 18 applies a first data value voltage, which is equal to $V_{DD}$ and represents logical "one", to the second electrode of capacitor 14 and applies a second data value voltage, which is equal to ground and represents logical "zero", to the second electrode of capacitor 24. The voltage across capacitor 14 is now equal to zero and the state of capacitor 14 changes from intermediate state 63 to neutral state 65 as shown in hysteresis loop 60 of FIG. 2. The voltage across capacitor 16 is now equal to $+V_{DD}$ and the state of capacitor 16 changes from intermediate state 64 to saturation state 66 as shown hysteresis loop 60 of FIG. 2. The voltage across capacitor 24 is now equal to $+V_{DD}$ and the state of capacitor 24 changes from intermediate state 64 to saturation state 66 as shown in hysteresis loop 60 of FIG. 2. The voltage across capacitor 26 is now equal to zero and the state of capacitor 26 changes from intermediate state 63 to neutral state 65 as shown in hysteresis loop 60 of FIG. 2.

At time $t_{10}$, complementary control signals 143 and 144 place pass gates 12 and 32 in conductive states. The first data value voltage, which represents a logical value of "one", is transmitted from the second electrode of capacitor 14 to node 41 via pass gate 12. Likewise, the second data value voltage, which represents a logical value complementary to "one", is transmitted from the second electrode of capacitor 24 to node 42 via pass gate 32. Thus a data of logical value "one" is read from register 10.

At time $t_{11}$, complementary control signals 143 and 144 place pass gates 12 and 32 in non-conductive states. Node 41 is isolated from capacitors 14 and 16 and node 42 is isolated from capacitors 24 and 26.

At time $t_{12}$, restoration signal 146 is raised to $V_{DD}$. The voltages across capacitors 14 and 16 are now equal to zero. The state of capacitor 14 remains in neutral state 65 and the state of capacitor 16 changes from saturation state 66 to polarization state 62 as shown in hysteresis loop 60 of FIG. 2. The voltages across capacitors 24 and 26 are now equal to $+V_{DD}$ and $V_{DD}$, respectively. The state of capacitor 24 remains in saturation state 66 and the state of capacitor 26 changes from neutral state 65 to saturation state 67 as shown in hysteresis loop 60 of FIG. 2.

At time $t_{13}$, restoration signal 146 is lowered to ground. Likewise, at time $t_{14}$, extraction signal 145 is lowered to ground. The voltages across capacitors 14 and 16 change from zero to $-V_{DD}$ and $+V_{DD}$, respectively. The state of capacitor 14 changes from neutral state 65 to saturation state 67 and the state of capacitor 16 changes from polarization state 62 to saturation state 66 as shown in hysteresis loop 60 of FIG. 2. The voltages across capacitors 24 and 26 change from $+V_{DD}$ and $-V_{DD}$, respectively, to zero. The state of capacitor 24 changes from saturation state 66 to polarization state 62 and the state of capacitor 26 changes from saturation state 67 to polarization state 61 as shown in hysteresis loop 60 of FIG. 2.

It should be noted that, in accordance with the present invention, the chronological order of times $t_{10}$, $t_{11}$, $t_{12}$, $t_{13}$, and $t_{14}$ is not limited to being exactly the same as that of the embodiment shown in read section 120 of timing diagram 100. The occurrence of the rising edge of restoration signal 146, time $t_{12}$, precedes the occurrence of the falling edge of restoration signal 146, time $t_{13}$. However, the operation of reading data from register 10 is independent of the chronological relation among restoration signal 146, the time interval from time $t_{10}$ to time $t_{11}$, and time $t_{14}$. For example, time $t_{12}$ can occur before time $t_{10}$ or time $t_{11}$, or after time $t_{14}$. Likewise, time $t_{14}$ can occur before time $t_{11}$ or time $t_{10}$.

At time $t_{15}$, complementary activation signals 147 and 148 switch off MOSFETs 27 and 28, respectively, resulting in voltage detector 18 being deactivated. The second electrodes of capacitors 14 and 24 are isolated from the applied data value voltages. Capacitors 14, 16, 24, and 26 remain in their respective states.

In a time interval between times $t_{16}$ and $t_{17}$, discharging signal 149 places MOSFETs 34 and 36 into conductive states, thereby discharging capacitors 14, 16, 24, and 26. The voltages across capacitors 14, 16, 24, and 26 are now equal to zero. Thus, capacitors 14 and 26 are in polarization state 61 and capacitors 16 and 24 are in polarization state 62 as shown in hysteresis loop 60 of FIG. 2. It should be noted that, in accordance with the present invention, discharging capacitors 14, 16, 24, and 26 is optional. If not discharged, the states of capacitors 14, 16, 24, and 26 change to their respective polarization states because of the leakage from ferroelectric capacitors. In either case, a logical "one" is restored in register 10.

In accordance with the present invention, an operation of reading data from register 10 when register 10 stores the second logical value, e.g., "zero", includes steps analogous to those for an operation of reading data from register 10 when register 10 stores the first logical value. It should be noted that, when register 10 stores a logical "zero", capacitors 14 and 26 are initially in polarization state 62 and capacitors 16 and 24 are initially in polarization state 61 as shown in hysteresis loop 60 of FIG. 2. Therefore, after the reading operation, data signal 141 is lowered to ground, which represents logical "zero", and complementary data signal 142 is raised to $V_{DD}$, which represents the complementary value of logical "zero".

By now it should be appreciated that a register and a method for writing data into and reading data from the register have been provided. In accordance with the present invention, transmitting data to and from the register does not require a sense amplifier and a capacitive bit line. Therefore, accessing data is fast and energy efficient. The registers of the present invention can be modularized and cascaded to construct memory blocks of different sizes depending on the application. Because a register of a few bits in length in accordance with the present invention occupies less area than one row of EEPROM, the present invention provides a silicon area efficient alternative to prior art registers. The registers in accordance with the present invention are especially beneficial in applications such as, for example, smart card and radio frequency tag applications, where a small memory block, e.g., thirty-two bytes in size, or the like, is needed in a very compact package.

I claim:

1. A non-volatile register, comprising:

a first capacitor with polarization retention having a first electrode and a second electrode, wherein the first electrode is coupled for receiving an extraction signal and the second electrode is coupled for transmitting a data signal;

a second capacitor with polarization retention having a first electrode and a second electrode, wherein the first electrode is coupled to the second electrode of the first capacitor and the second electrode is coupled for receiving a restoration signal;

a third capacitor with polarization retention having a first electrode and a second electrode, wherein the first electrode is coupled to the first electrode of the first capacitor and the second electrode is coupled for transmitting a complementary data signal;

a fourth capacitor with polarization retention having a first electrode and a second electrode, wherein the first electrode is coupled the second electrode of the third capacitor and the second electrode is coupled to the second electrode of the second capacitor;

a voltage detector having a first voltage electrode, a second voltage electrode, a first control electrode, and a second control electrode, wherein the first voltage electrode is coupled to the second electrode of the first capacitor and the second voltage electrode is coupled to the second electrode of the third capacitor;

a first switch having a control electrode, a first current conducting electrode, and a second current conducting electrode, wherein the control electrode is coupled for receiving a first activation signal, the first current conducting electrode is coupled for receiving a first voltage level, and the second current conducting electrode is coupled to the first control electrode of the voltage detector; and a second switch having a control electrode, a first current conducting electrode, and a second current conducting electrode, wherein the control electrode is coupled for receiving a second activation signal, the first current conducting electrode is coupled for receiving a second voltage level, and the second current conducting electrode is coupled to the second control electrode of the voltage detector.

2. The non-volatile register of claim 1, wherein the first capacitor, the second capacitor, the third capacitor, and the fourth capacitor are ferroelectric capacitors.

3. The non-volatile register of claim 1, wherein the first switch is an n-channel metal oxide semiconductor field effect transistor and the second switch is a p-channel metal oxide semiconductor field effect transistor.

4. The non-volatile register of claim 1, wherein the voltage detector comprises:

a first inverter having an input, an output, a first enable electrode, and a second enable electrode, wherein the input is coupled to the first voltage electrode of the voltage detector, the output is coupled to the second voltage electrode of the voltage detector, the first enable electrode is coupled to the first control electrode of the voltage detector, and the second enable electrode is coupled to the second control electrode of the voltage detector; and a second inverter having an input, an output, a first enable electrode, and a second enable electrode, wherein the input is coupled to the second voltage electrode of the voltage detector, the output is coupled to the first voltage electrode of the voltage detector, the first enable electrode is coupled to the first control electrode of the voltage detector, and the second enable electrode is coupled to the second control electrode of the voltage detector.

5. The non-volatile register of claim 4, wherein the first inverter comprises:

a third switch having a control electrode, a first current conducting electrode, and a second current conducting electrode, wherein the control electrode is coupled to the input of the first inverter, the first current conducting electrode is coupled to the first enable electrode of the first inverter, and the second current conducting electrode is coupled to the output of the first inverter; and a fourth switch having a control electrode, a first current conducting electrode, and a second current conducting electrode, wherein the control electrode is coupled to the input of the first inverter, the first current conducting electrode is coupled to the second enable electrode of the first inverter, and the second current conducting electrode is coupled to the output of the first inverter.

6. The non-volatile register of claim 5, wherein the third switch is an n-channel metal oxide semiconductor field effect transistor and the fourth switch is a p-channel metal oxide semiconductor field effect transistor.

7. The non-volatile register of claim 4, wherein the second inverter comprises:

a fifth switch having a control electrode, a first current conducting electrode, and a second current conducting electrode, wherein the control electrode is coupled to the input of the second inverter, the first current conducting electrode is coupled to the first enable electrode of the second inverter, and the second current conducting electrode is coupled to the output of the second inverter; and a sixth switch having a control electrode, a first current conducting electrode, and a second current conducting electrode, wherein the control electrode is coupled to the input of the second inverter, the first current conducting electrode is coupled to the second enable electrode of the second inverter, and the second current conducting electrode is coupled to the output of the second inverter.

8. The non-volatile register of claim 7, wherein the fifth switch is a n-channel metal oxide semiconductor field effect transistor and the sixth switch is a p-channel metal oxide semiconductor field effect transistor.

9. The non-volatile register of claim 1, wherein the second electrode of the first capacitor is coupled for transmitting the data signal via a first pass gate and the second electrode of the third capacitor is coupled for transmitting the complementary data signal via a second pass gate, wherein the first pass gate includes a first control electrode coupled for receiving a control signal, a first data electrode coupled for transmitting the data signal, and a second data electrode coupled to the second electrode of the first capacitor, and wherein the second pass gate includes a first control electrode coupled for receiving the control signal, a first data electrode coupled for transmitting the complementary data signal, and a second data electrode to the second electrode of the third capacitor.

10. The non-volatile register of claim 9, wherein the first pass gate comprises:

a second control electrode coupled for receiving a complementary control signal;

a seventh switch having a control electrode, a first current conducting electrode, and a second current conducting electrode, wherein the control electrode is coupled to the first control electrode of the first pass gate, the first current conducting electrode is coupled to the first data electrode of the first pass gate, and the second current conducting electrode is coupled to the second data electrode of the first pass gate; and an eighth switch having a control electrode, a first current conducting electrode, and a second current conducting electrode, wherein the control electrode is coupled to the second control electrode of the first pass gate, the first current conducting electrode is coupled to the first data electrode of the first pass gate, and the second current conducting electrode is coupled to the second data electrode of the first pass gate.

11. The non-volatile register of claim 10, wherein the seventh switch is an n-channel metal oxide semiconductor field effect transistor and the eighth switch is a p-channel metal oxide semiconductor field effect transistor.

12. The non-volatile register of claim 9, wherein the second pass gate comprises:

a second control electrode coupled for receiving a complementary control signal;

an n-channel metal oxide semiconductor field effect transistor having a gate electrode, a source electrode, and a drain electrode, wherein the gate electrode is coupled to the first control electrode of the second pass gate, the source electrode is coupled to the first data electrode of the second pass gate, and the drain electrode is coupled to the second data electrode of the second pass gate; and a p-channel metal oxide semiconductor field effect transistor having a gate electrode, a source electrode, and a drain electrode, wherein the gate electrode is coupled to the second control electrode of the second pass gate, the source electrode is coupled to the first data electrode of the second pass gate, and the drain electrode is coupled to the second data electrode of the second pass gate.

13. The non-volatile register of claim 1, further comprising:

a ninth switch having a control electrode, a first current conducting electrode, and a second current conducting electrode, wherein the control electrode is coupled for receiving a discharging signal, the first current conducting electrode is coupled for receiving the first voltage level, and the second current conducting electrode is coupled to the second electrode of the first capacitor; and a tenth switch having a control electrode, a first current conducting electrode, and a second current conducting electrode, wherein the control electrode is coupled for receiving the discharging signal, the first current conducting electrode is coupled for receiving the first voltage level, and the second current conducting electrode is coupled to the second electrode of the third capacitor.

14. The non-volatile register of claim 13, wherein the ninth switch and the tenth switch are n-channel metal oxide semiconductor field effect transistors.

15. A method for writing data into a non-volatile register, comprising the steps of:

providing the non-volatile register having a first capacitor with polarization retention having a first electrode and a second electrode, a second capacitor with polarization retention having a first electrode and a second electrode, a third capacitor with polarization retention having a first electrode and a second electrode, a fourth capacitor with polarization retention having a first electrode and a second electrode, wherein the second electrode of the first capacitor is coupled to the first electrode of the second capacitor and the second electrode of the third capacitor is coupled to the first electrode of the fourth capacitor;

transmitting a data signal to the second electrode of the first capacitor and transmitting a complementary data signal to the second electrode of the third capacitor;

applying a first extraction voltage to the first electrode of the first capacitor and to the first electrode of the third capacitor;

applying a first restoration voltage to the second electrode of the second capacitor and to the second electrode of the fourth capacitor;

applying a second extraction voltage to the first electrode of the first capacitor and to the first electrode of the third capacitor;

applying a second restoration voltage to the second electrode of the second capacitor and to the second electrode of the fourth capacitor; and isolating the second electrode of the first capacitor and the second electrode of the third capacitor from an applied voltage level to store data in the non-volatile register.

16. The method for writing data into a non-volatile register as claimed in claim 15, further comprising the step of discharging the first capacitor, the second capacitor, the third capacitor, and the fourth capacitor after the step of isolating the second electrode of the first capacitor and the second electrode of the third capacitor.

17. A method for reading data from a non-volatile register, comprising the steps of:

providing the non-volatile register having a first capacitor with polarization retention having a first electrode and a second electrode, a second capacitor with polarization retention having a first electrode and a second electrode, a third capacitor with polarization retention having a first electrode and a second electrode, a fourth capacitor with polarization retention having a first electrode and a second electrode, wherein the second electrode of the first capacitor is coupled to the first electrode of the second capacitor and the second electrode of the third capacitor is coupled to the first electrode of the fourth capacitor;

generating a first voltage across the first electrode of the first capacitor and the second electrode of the second capacitor and across the first electrode of the third capacitor and the second electrode of the fourth capacitor;

generating a first difference voltage by subtracting a voltage across the fourth capacitor from a voltage across the second capacitor;

applying a first data value voltage to the second electrode of the first capacitor and applying a second data value voltage to the second electrode of the third capacitor, wherein a polarity of a second difference voltage generated by subtracting the second data value voltage from the first data value voltage is identical to a polarity of the first difference voltage;

sensing the first data value voltage and the second data value voltage to read a logical value from the non-volatile register;

applying a first extraction voltage to the first electrode of the first capacitor and to the first electrode of the third capacitor;

applying a first restoration voltage to the second electrode of the second capacitor and to the second electrode of the fourth capacitor;

applying a second extraction voltage to the first electrode of the first capacitor and to the first electrode of the third capacitor;

applying a second restoration voltage to the second electrode of the second capacitor and to the second electrode of the fourth capacitor; and removing the first data value voltage applied to the second electrode of the first capacitor and removing the second data value voltage applied to the second electrode of the third capacitor.

18. The method for reading data from a non-volatile register as claimed in claim 17, wherein the step of generating a first voltage across the first electrode of the first capacitor and the second electrode of the second capacitor and across the first electrode of the third capacitor and the second electrode of the fourth capacitor includes the steps of:

applying the first extraction voltage to the first electrode of the first capacitor and to the first electrode of the third capacitor; and applying the second restoration voltage to the second electrode of the second capacitor and to the second electrode of the fourth capacitor.

19. The method for reading data from a non-volatile register as claimed in claim 17, further comprising the step of discharging the first capacitor, the second capacitor, the third capacitor, and the fourth capacitor after the step of removing the first data value voltage and removing the second data value voltage.

20. The method for reading data from a non-volatile register as claimed in claim 19, wherein the step of discharging the first capacitor, the second capacitor, the third capacitor, and the fourth capacitor includes the steps of:

applying a discharging voltage to the second electrode of the first capacitor and to the second electrode of the third capacitor; and removing the discharging voltage applied to the second electrode of the first capacitor and to the second electrode of the third capacitor.

* * * * *